United States Patent
Sturm et al.

(10) Patent No.: US 7,492,648 B2
(45) Date of Patent: Feb. 17, 2009

(54) REDUCING LEAKAGE CURRENT IN MEMORY DEVICE USING BITLINE ISOLATION

(75) Inventors: Andre Sturm, Essex Junction, VT (US); Christopher Miller, Underhill, VT (US); Wolfgang Hokenmaier, Burlington, VT (US); Michael Killian, Richmond, VT (US); Jochen Hoffman, Colchester, VT (US)

(73) Assignee: Infineon Technologies AG, Neubiberg (DE)

( * ) Notice: Subject to any disclaimer, the term of this patent is extended or adjusted under 35 U.S.C. 154(b) by 287 days.

(21) Appl. No.: 11/387,879

(22) Filed: Mar. 24, 2006

(65) Prior Publication Data

US 2007/0223302 A1    Sep. 27, 2007

(51) Int. Cl.
*G11C 7/08*   (2006.01)
*G11C 8/12*   (2006.01)

(52) U.S. Cl. .............. 365/195; 365/196; 365/200; 365/225.7; 365/230.03

(58) Field of Classification Search ........ 365/195, 365/196, 200, 201, 225.7, 230.06, 230.03; 714/710, 711
See application file for complete search history.

(56) References Cited

U.S. PATENT DOCUMENTS

| | | | |
|---|---|---|---|
| 5,262,993 A * | 11/1993 | Horiguchi et al. ........ | 365/200 |
| 5,673,231 A | 9/1997 | Furutani | |
| 6,016,279 A | 1/2000 | Chi | |
| 6,018,481 A | 1/2000 | Shiratake | |
| 6,343,038 B1 | 1/2002 | Makino et al. | |
| 6,452,859 B1 | 9/2002 | Shimano et al. | |
| 6,850,454 B2 | 2/2005 | Kuge et al. | |
| 7,106,641 B2 | 9/2006 | Tsukada | |
| 2004/0047225 A1 | 3/2004 | Hayakawa | |

* cited by examiner

*Primary Examiner*—J. H. Hur
(74) *Attorney, Agent, or Firm*—Edell, Shapiro & Finnan, LLC

(57) ABSTRACT

A method for reducing defect leakage current in a semiconductor memory device comprising a plurality of memory banks, each memory bank comprising a plurality of memory arrays and sense amplifier columns comprising a plurality of sense amplifiers, wherein there is a sense amplifier column positioned between and shared by memory arrays on opposites thereof. At least one bank-specific isolation control signal is independently generated for each of the plurality of memory banks depending on existence and location of an anomalous bitline leakage in a memory bank. The at least one bank-specific isolation control signal is supplied to at least one sense amplifier column in the corresponding memory bank to isolate at least one side to at least one memory array that is in an unselected state in a corresponding memory bank.

11 Claims, 8 Drawing Sheets

REDUCING LEAKAGE CURRENT IN MEMORY DEVICE USING BITLINE ISOLATION

BACKGROUND OF THE INVENTION

FIG. 1A illustrates a sense amplifier 50 in a state-of-the art dynamic random access memory (DRAM) device comprising a complementary pair of bitlines (BL and BL/) 10 and 12 that intersect with wordlines (WLs) 20 and 22. Only two WLs are shown for simplicity. There is a multiplexer circuit 30 and an equalizer circuit 40 that control the connection and isolation of a sense amplifier 50 with memory array cells at the intersection of the BLs 10 and 12 with WLs 20 and 22. Exemplary memory cells are shown at 60 and 62.

There are also WLs 70 and 72 on the opposite side of the sense amplifier 50 that intersect with BLs 16 and 18. At the intersection there are memory array cells 80 and 82. The sense amplifier 50 is shared by the memory arrays on both sides. There is a multiplexer circuit 90 and equalizer circuit 95 that control the connection and isolation of the sense amplifier 50 with the memory array on the other side. For purposes of this description, the left side memory array is the "t" side and the right side is the "b" side. It should be understood that there is an instance of the circuitry shown in FIG. 1A for each BL pair and in practice there is typically a column of sense amplifiers and their associated multiplexer and equalization circuitry.

The primary purpose of multiplexer circuits 30 and 90 is to isolate the BLs of the unselected memory array during a sense operation (of the selected memory array) and to allow the sense amplifier internal nodes to be precharged via the BL and /BL nodes. The multiplexer is also used to connect the sense amplifier internal nodes to the bitlines of the selected array for reading from and writing to the memory cell. Multiplexer circuit 30 is controlled by multiplexer control signal MUXb and multiplexer circuit 90 is controlled by multiplexer control signal MUXt.

FIG. 1B shows an example of a conventional multiplexer control circuit 100. In practice, there is a multiplexer control circuit that generates the MUXt control signal for controlling the multiplexers on the "t" side of a column of sense amplifiers and a multiplexer control circuit that generates the MUXb control signal for controlling the multiplexers on the "b" side of column of sense amplifiers. The inputs to the multiplexer control circuit 100 are a SELECT signal and an isolation control signal ISOOFF. Generally, the SELECT signal goes high when the memory array on that side ("b" side or "t" side) of the sense amplifier is to be accessed causing the multiplexer control signal to go high, and otherwise is low. The ISOOFF signal goes high when that side of the sense amplifier is to be isolated, causing the multiplexer control signal to go low. The equalization circuits 40 and 95 are controlled by equalization control signals EQLb and EQLt, respectively. The operation is as follows.

In normal operation when a memory array is unselected, the equalizer circuits 40 and 95 are on, precharging BL and /BL and both multiplexer control signals (MUXt and MUXb) are set to a voltage that is high enough to turn on the multiplexer transistors such that the internal sense amplifier nodes (SA and /SA) are brought to the same potential as BL nodes BL and /BL. When a memory cell is selected in an array on one side of the sense amplifier 50 the equalization circuit transistors on that side are turned off while the multiplexer control signal on that side is boosted to a high enough voltage to permit fast reading and writing of data between the internal sense amplifier nodes (SA and /SA) and the BLs (BL and /BL) and the selected array cell. At the same time the multiplexer control signal for the unselected array is turned off to isolate the unselected array for the duration of the memory access while the equalization circuit of the unselected array remains on. The WL to the selected memory cell is then brought to a voltage that is high enough to turn on the cell access transistor and effectively connect the cell capacitor to a bitline (BL or /BL) and after a sufficient time the sense amplifier 50 is turned on to amplify the resulting voltage difference of BL and /BL to a full digital data signal. At the completion of an array access operation the WL is reset back to the unselected potential, the sense amplifier 50 is turned off, and the multiplexer control signals (MUXb and MUXt) and the equalization control signals EQLt and EQLb are returned to the precharging condition.

The multiplexer circuits 30 and 90 devices are normally used to isolate BL nodes from internal sense amplifier nodes during sensing but they can also be used to isolate BL nodes from internal sense amplifier nodes at other times for other purposes. The multiplexer circuits 30 and 90 can be used to isolate BL nodes from internal sense amplifier nodes for reducing bitline leakage due to defects.

Defect leakage current can result from WL-BL short-circuit conditions, thereby consuming more current during standby and self-refresh modes of a memory device. One solution to reduce the impact of WL-BL shorts is the use of a depletion mode n-type field effect transistor (NFET) in the equalization circuits to further limit current sourced into BLs. To fully realize the benefit of a depletion mode NFET current limiter device requires that the shorted BLs be isolated from the sense amplifier nodes by turning off the multiplexers 30 and 90 referred to above.

BL isolation techniques heretofore known only reduce leakage current during self-refresh state of a memory device. In addition, conventional BL isolation techniques involve isolating simultaneously all memory banks with no ability to control the isolation in one bank differently from the isolation in another bank.

Thus, there is room for expanding the benefits of BL isolation in a semiconductor memory device.

SUMMARY OF THE INVENTION

Briefly, a method is provided for reducing defect leakage current in a semiconductor memory device comprising a plurality of memory banks, each memory bank comprising a plurality of memory arrays and sense amplifier columns comprising a plurality of sense amplifiers, wherein there is a sense amplifier column positioned between and shared by memory arrays on opposites thereof. At least one bank-specific isolation control signal is independently generated for each of the plurality of memory banks depending on existence and location of an anomalous bitline leakage in a memory bank. The at least one bank-specific isolation control signal is supplied to at least one sense amplifier column in the corresponding memory bank to isolate at least one side of at least one memory array that is in an unselected state in a corresponding memory bank.

DETAILED DESCRIPTION

Figure 1A:
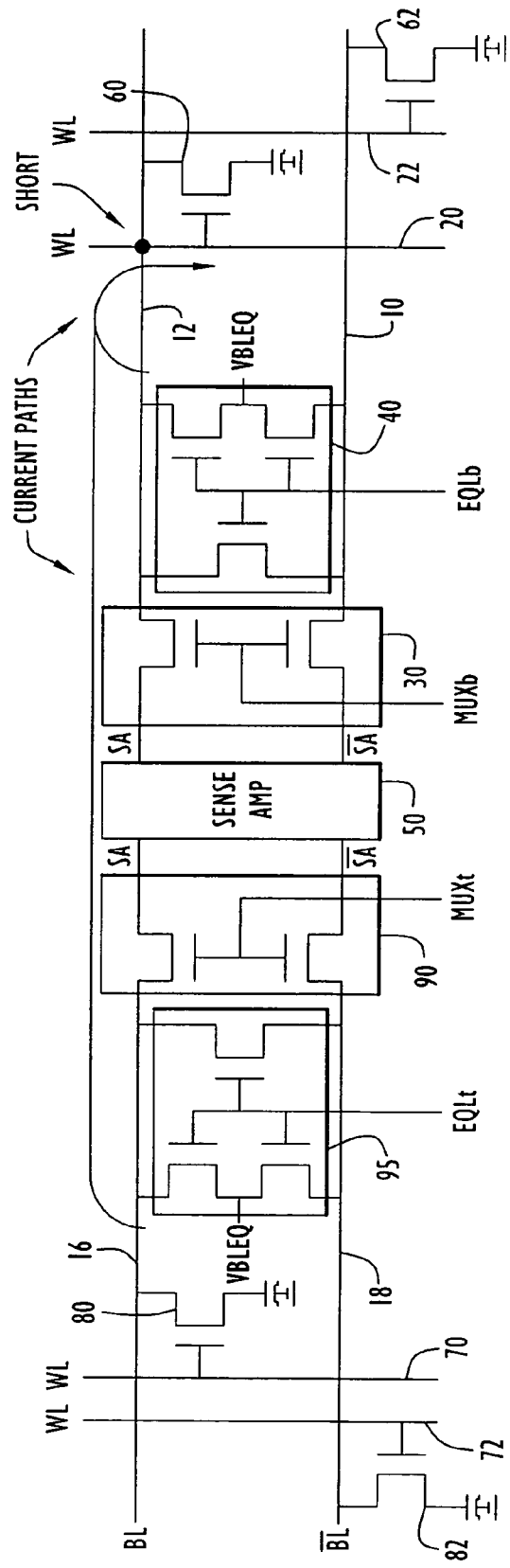
FIG. 1A is a block diagram showing a sense amplifier connected between two memory arrays of a conventional memory device.
Figure 1B:
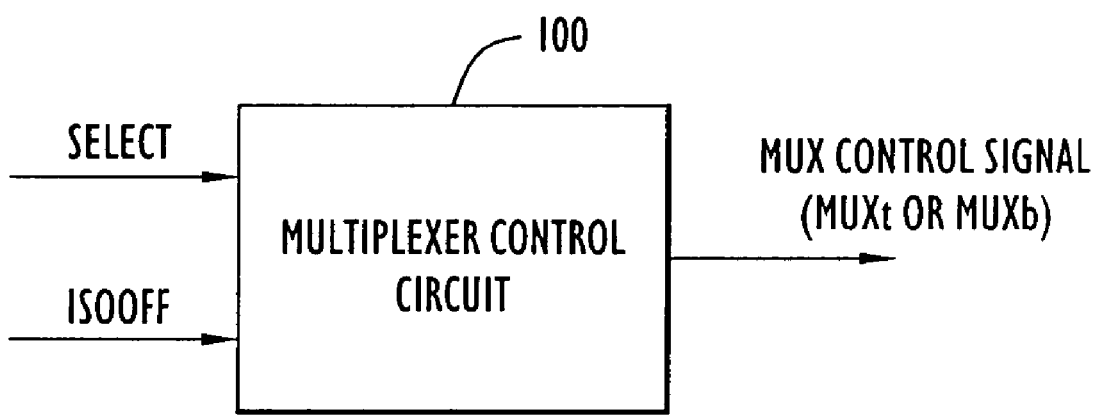
FIG. 1B is a block diagram of a conventional multiplexer control circuit.

According to an embodiment of the present invention, reduction of defect leakage current is achieved by providing independent BL isolation control within each "bank" comprised of memory arrays (also called array segments) interspersed with sense amplifier (SA) columns. In a column of sense amplifiers, there is an instance of the sense amplifier circuitry shown in FIG. 1A for each bitline pair and there is a multiplexer control circuit 100 as generally shown in FIG. 1B for each of the "t" side and "b" sides for each column of sense amplifiers. In case the adjacent memory array is in an unselected state, the isolation control signals causes the gate of one (or both) of the multiplexers to connect to ground, rather than VINT, to isolate the BLs of the adjacent memory array (having an anomalous bitline leakage) from the sense amplifier to reduce leakage current. This BL isolation feature is applicable in active, self-refresh and standby modes of the memory device. The BL isolation control techniques according to the embodiments described herein may be used to isolate a memory array that has an anomalous bitline leakage that may be due to low resistive path defects (e.g., short-circuits), excessive junction leakage, or other causes.

Figure 2:
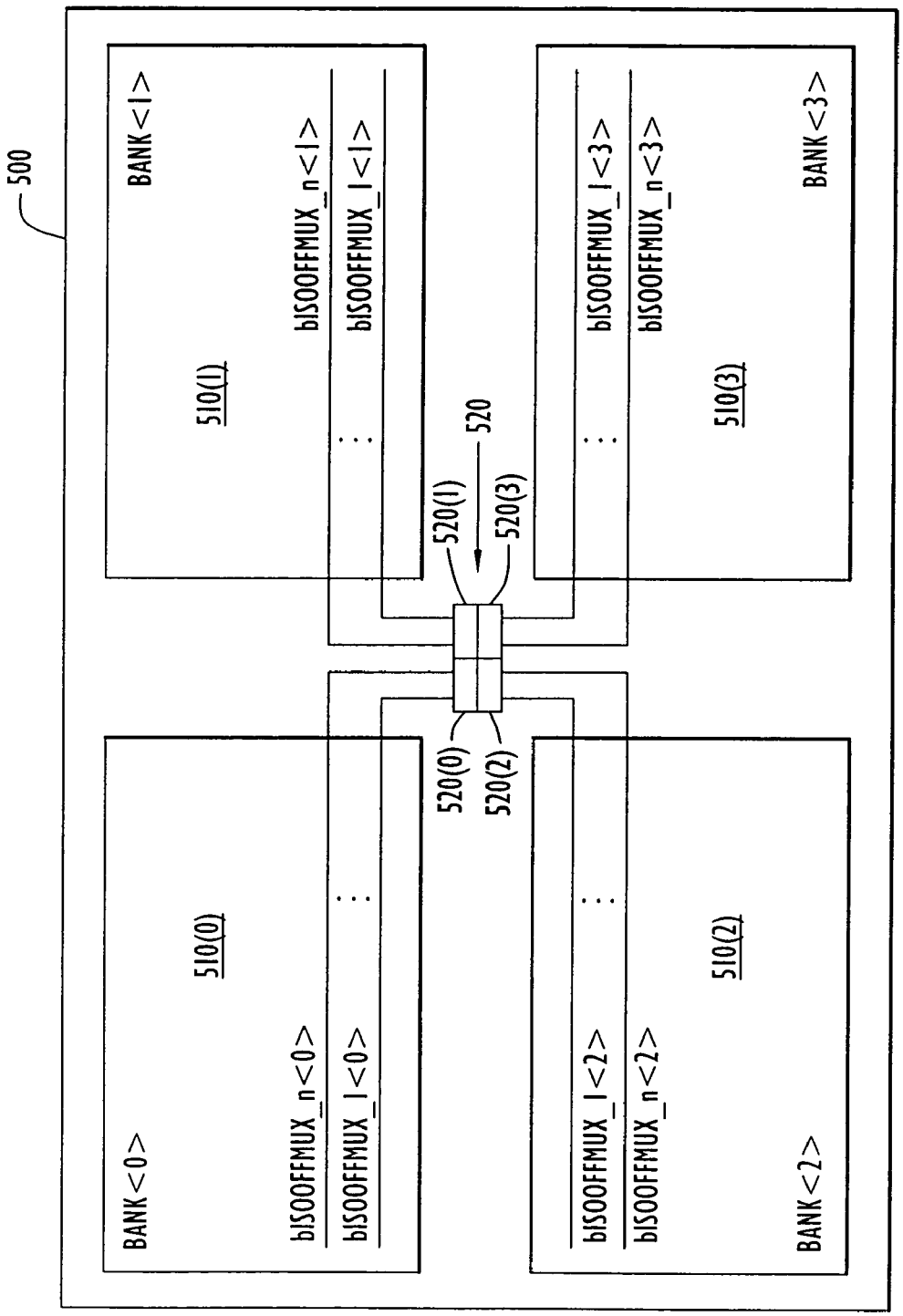
FIG. 2 is a block diagram of a memory device depicting an embodiment of the present invention.

Referring first to FIG. 2, one embodiment for bank-specific BL isolation is shown. FIG. 2 illustrates a semiconductor integrated circuit memory device 500 having four memory array quadrants or banks 510(0) to 510(3). Each bank has independent selection control for BL isolation of its array segments. In one embodiment, there is a section 520 on the memory device 500 allocated for bank-specific BL isolation control logic, comprising individual bank-specific control logic subsections 520(0)-520(3) for the corresponding banks 510(0) to 510(3).

The intelligence to keep track of which memory array segments have an anomalous bitline leakage is contained in manufacturing programs and databases. The memory device 500 is interrogated by test equipment and the test results are stored in computer system files and processed off-line by various analysis programs. These programs create a database file that is accessed when a wafer arrives at a fuse programming tool. The database file tells the fuse programming tool on which memory devices and which array segments on the memory device the isolation feature is to be activated.

Each bank-specific BL isolation control logic subsection 520(0) to 520(3) independently generates one or more isolation control signals for the corresponding bank The bank-specific BL isolation control signals are labeled bISOOFFMUX_1<i> to bISOOFFMUX_n<i>, where i is a bank index or identifier, for i=0 to 3 in the embodiment shown in FIG. 2. There are numerous routing possibilities for the one or more bank-specific BL isolation control signals and exemplary embodiments are described hereinafter in conjunction with FIGS. 5-8.

Figure 3:
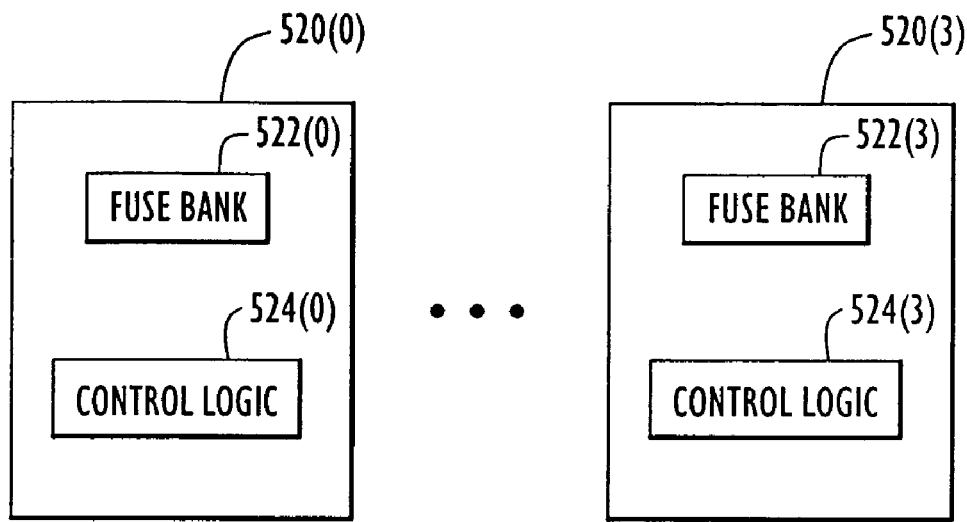
FIGS. 3 and 4 are block diagrams illustrating embodiments according to the invention for storing information identifying defects for a memory device.

Turning to FIG. 3, according to one embodiment, the information indicating which memory array segments in a bank have anomalous BL leakage is stored in a dedicated fuse bank 522(i) in the corresponding BL isolation control subsection 510(i), for i=0 to 3. One or more of the fuses in a fuse bank 522(i) are blown to indicate which memory array segments in the corresponding memory bank have anomalous BL leakage to be isolated during the unselected state. There is a control logic block 524(i) in each BL isolation control subsection 510(i), for i=0 to 3, that generates the bank-specific isolation control signals bISOOFFMUX_1<i> to bISOOFFMUX_n<i> for that bank based on the information represented by the fuse bank 522(i), operating mode of the memory device and test mode control.

Figure 4:
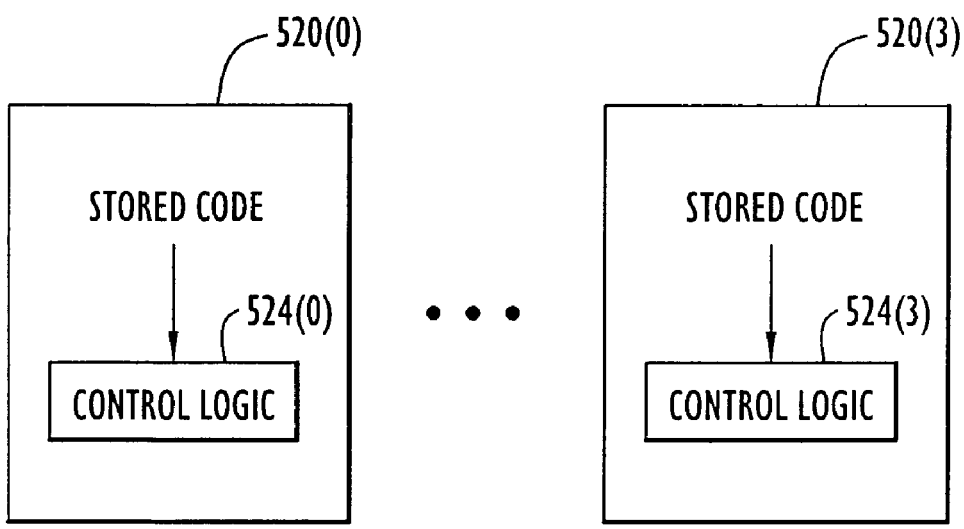

Alternatively, as shown in the embodiment of FIG. 4, instead of representing the locations of the BL-WL short-circuits in a fuse bank, a programmable code is stored in allocated registers located in the bank-specific BL isolation control sections 510(0) to 510(3). The programmable code may be generated and stored in the memory device 500 during a test mode procedure after the location of the defects have been determined. In this embodiment, the control logic block 524(i) generates the bank-specific isolation control signals bISOOFFMUX_1<i> to bISOOFFMUX_n<i> based on the stored code in each BL isolation control subsection 510(i), for i=0 to 3, operating mode of the memory device and test mode control.

Referring now to FIGS. 5A, 5B and 6-8, wire routing schemes for the bank-specific BL isolation control signals will be described according to several exemplary embodiments. In each of FIGS. 5A, 5B and 6-8, the routing configuration is shown for only one bank, generally referred to as bank 510(i). It should be understood that the routing in all of the banks 510(0) to 510(3) may be similar. These figures illustrate a simplified view of a bank 510(i) comprising memory arrays or array segments 530(k), for k=0 to 3 in this exemplary embodiment, interspersed by sense amplifier (SA) columns 540(m), for m=0 to 4. Each SA column includes multiple instances of the sense amplifier circuitry such as that shown in FIG. 1A, where for each bitline pair there is an equalization and a multiplexer circuit positioned between the sense amplifier and the memory arrays on opposite sides of the sense amplifier. Though not shown in these figures, it should be understood that there are two multiplexer control circuits such as that shown in FIG. 1B, one dedicated to controlling the multiplexers on the "t" side of each sense amplifier column and one dedicated to controlling the multiplexers on the "b" side. The "t" and "b" designations on the SA columns 540(0) to 540(3) indicate the "t" side and "b" isolation control inputs, respectively, to the "t" side and "b" multiplexer circuits. The bISOOFFMUX isolation control signals shown in FIGS. 5A, 5B and 6-8 are analogous to the ISOOFF signal shown in FIG. 1B.

Figure 5A:
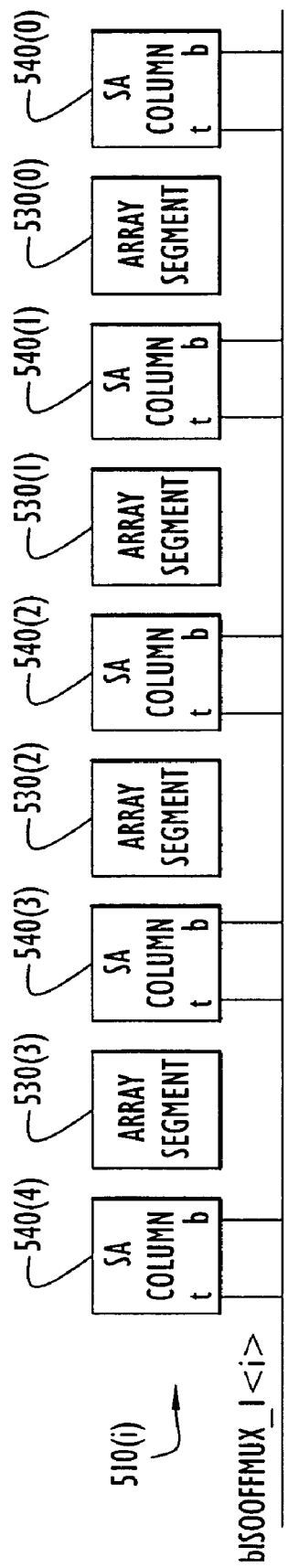
FIGS. 5A, 5B and 6-8 are block diagrams depicting various embodiments according to the invention for routing isolation control signals to sense amplifiers in a memory bank.

FIG. 5A illustrates an isolation signal routing according to one embodiment where, a single wire is used to route a single BL isolation control signal bISOOFFMUX_1<i> to each bank. This embodiment sacrifices selectivity for routing convenience and space. Since only a single bank-specific isolation control signal is generated and connected to all of the b and t sides of the SA columns, then it can either cause all or none of the SA columns to isolate from the adjacent array segments. This may be desirable in case an anomalous bitline leakage spans one or more neighboring bitlines.

Figure 5B:
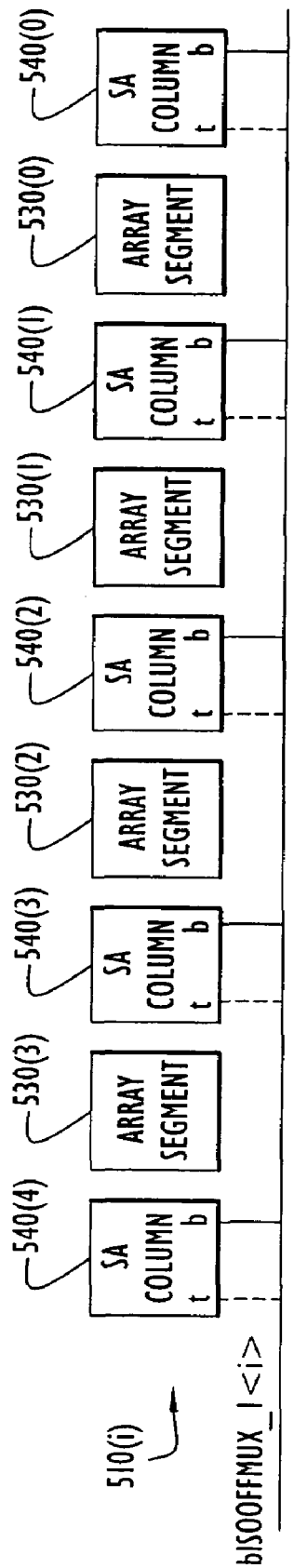

In another embodiment shown in FIG. 5B, the single wire could be wired to either all "b" sides or all "t" sides of the SA columns. This is indicated in FIG. 5B as a solid line to the "b" sides of each of the SA columns and a dotted line the "t" sides of each of the SA columns. This might be desirable if a defect is affecting only a single bitline.

Figure 6:
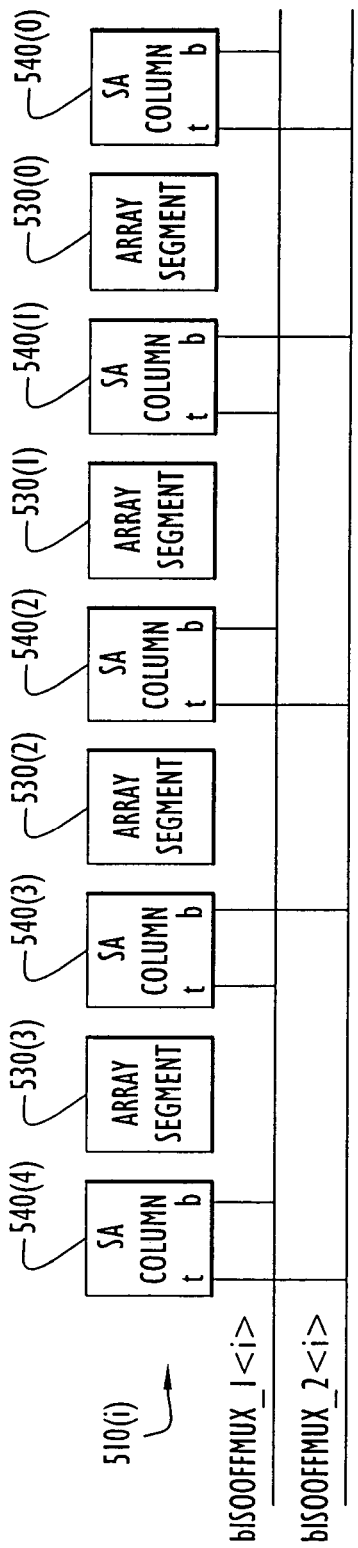
Figure 7:
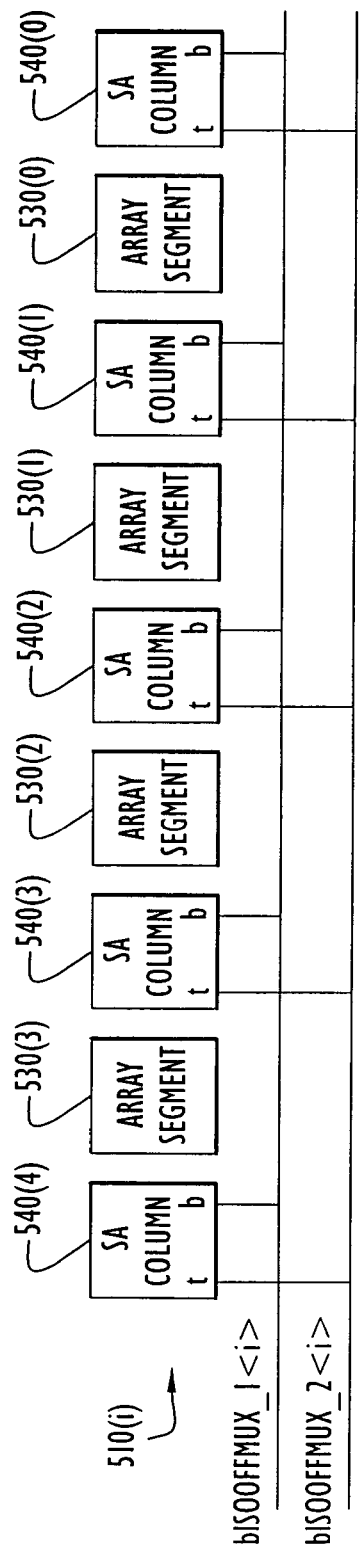

FIGS. 6 and 7 illustrate a two-wire/two-signal isolation control signal routing scheme with more selectivity than the embodiment of FIG. 5. The two bank-specific isolation control signals are labeled bISOOFFMUX_1<i> and bISOOFFMUX_2<i>.

FIG. 6 shows that the bISOOFFMUX_1<i> signal is connected to the "b" side isolation control input of SA columns 540(0), 540(2) and 540(4) and to the "t" side isolation control input of SA columns 540(1) and 540(3) such that odd numbered memory array segments, e.g., segments 530(1) and 530(3), are fully (on both sides) isolated from their adjacent SA columns when bISOOFFMUX_1<i> is asserted. Similarly, the bISOOFFMUX_2<i> signal is connected to the "b" side isolation control input of SA columns 540(1) and 540(3) and to the "t" side input of the SA columns 540(0), 540(2) and 540(4) such that even numbered memory array segments, e.g., segments 530(0) and 530(2), are fully (on both sides) isolated from the adjacent sense amplifier banks when bISOOFFMUX_2<i> is asserted. The isolation control signal routing shown in the embodiment on FIG. 6 is useful when both MUX sides to all even or to all odd numbered array banks are to be turned off to fully isolate from an array segment having an anomalous bitline leakage that spans one or more neighboring bitlines.

FIG. 7 shows an isolation control signal routing configuration according to another embodiment. In this embodiment, the bISOOFFMUX_1<i> signal is connected to the "b" side input of all of the SA columns 540(0) to 540(4) and the bISOOFFMUX_2<i> signal is connected to the "t" side input of all of the SA columns 540(0) to 540(4). When bISOOFFMUX_1<i> is asserted, the memory array segments on the "b" side of all SA columns are isolated from this SA column. That is, when the bISOOFFMUX_1<i> signal is asserted, the "b" side of the SA column 540(4) is isolated from memory array segment 530(3), the "b" side of the SA column 540(3) is isolated from memory array segment 530(2), the "b" side of SA column 540(2) is isolated from memory array segment 530(1), and the b side of SA column 540(1) is isolated from memory array segment 530(0). When bISOOFFMUX_2<i> is asserted, the memory array segments on the "t" side of all SA columns 540(0) to 540(4) are isolated. That is, when the bISOOFFMUX_2<i> signal is asserted, the "t" side of SA columns 540(0) is isolated from memory array segment 530(0), the "t" side of sense amplifier column 540(1) is isolated from memory array segment 530(1), and so on. If both the bISOOFFMUX_1<i> signal and the bISOOFFMUX_2<i> signal is asserted, then both sides of all SA columns are isolated from their memory arrays in the unselected state.

Figure 8:
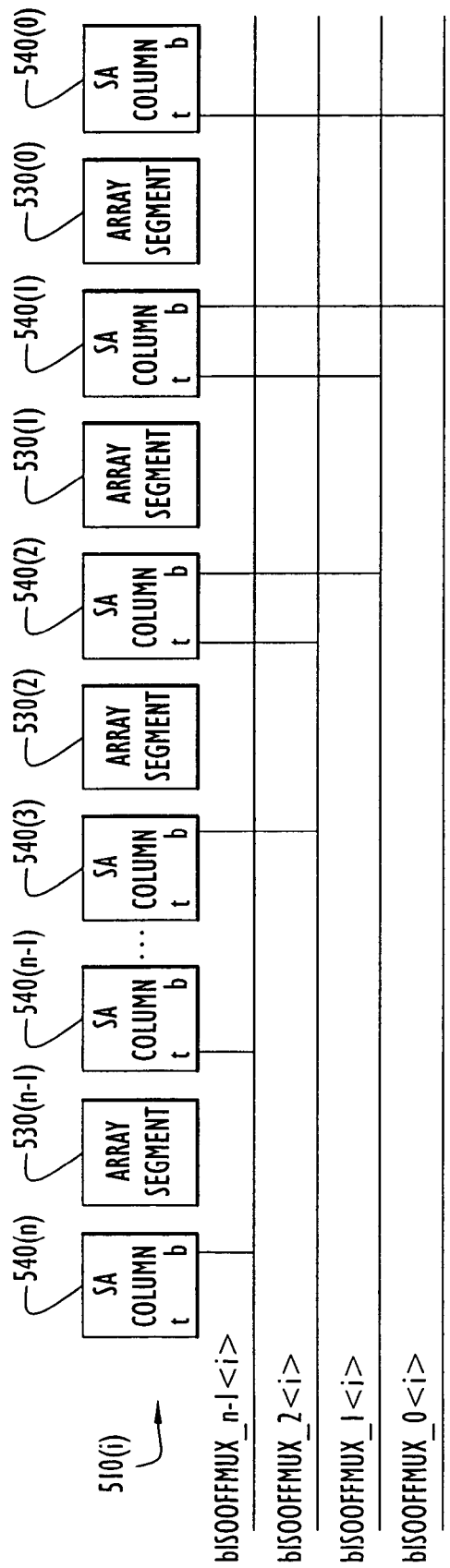

FIG. 8 illustrates an isolation control signal routing embodiment with even more selectivity. In this embodiment, for each bank 510(i) having in general n array segments, there are the same number n, of isolation control signals bISOOFFMUX<i> signals, identified as bISOOFFMUX_0<i> to bISOOFFMUX_n-1<i>, each routed on a dedicated wire to the SA columns on opposite sides of a corresponding one of array segments 530(0) to 530(n-1). For example, the isolation control signal bISOOFFMUX_0<i> is routed to the "t" side control input of SA column 540(0) and the "b" side control input of SA column 540(1) so that when bISOOFFMUX_0<i> is asserted, the array segment 530(0) is completely isolated from its adjacent SA columns in the unselected state. The same holds true for isolation control signal bISOOFFMUX_1<i> and the array segment 530(1), bISOOFFMUX_2<i> and the array segment 530(2), and isolation control signal bISOOFFMUX_*n*-1<i> and array segment 530(n-1).

The BL isolation control techniques described in the various embodiments herein may be used with multiplexer control circuits heretofore known or hereinafter developed. As such, details of the multiplexer control circuits are not provided herein.

There are many advantages to the BL isolation control techniques according to the embodiments described herein. These BL isolation techniques provide flexible granularity of BL isolation according to occurrence and location of a defect causing anomalous BL leakage. Moreover, these techniques allow for flexible selection of all or individual banks and for flexible selection of different memory arrays within a bank. Thus, a memory device employing these techniques has decreased power consumption. In addition, these BL isolation control techniques are applicable in active, standby and self-refresh modes of the memory device.

The system and methods described herein may be embodied in other specific forms without departing from the spirit or essential characteristics thereof. The foregoing embodiments are therefore to be considered in all respects illustrative and not meant to be limiting.

What is claimed is:

1. A method for reducing defect leakage current in a semiconductor memory device comprising a plurality of memory banks, each memory bank comprising a plurality of memory arrays and sense amplifier columns comprising a plurality of sense amplifiers, wherein there is a sense amplifier column positioned between and shared by memory arrays on opposites thereof, the method comprising:
   a. independently generating first and second bank-specific isolation control signals for each of the plurality of memory banks depending on existence and location of an anomalous bitline leakage in a memory bank; and
   b. supplying the first and second bank-specific isolation control signals to sense amplifier columns in corresponding memory banks such that the same side of all the sense amplifier columns in a memory bank is isolated from a memory array when in an unselected state.

2. The method of claim 1, wherein supplying comprises supplying the first and second bank-specific isolation control signals to the sense amplifier columns in the corresponding memory banks such that both sides of all the sense amplifier columns in a memory bank are isolated from memory arrays.

3. The method of claim 1, and further comprising storing information identifying locations in a memory bank having an anomalous bitline leakage for each of the memory banks.

4. The method of claim 3, wherein storing comprises blowing one or more fuses associated with each of the plurality of memory banks to represent information locations in a memory bank having an anomalous bitline leakage for each of the memory banks, and wherein said independently generating is based on states of fuses for the corresponding memory bank.

5. The method of claim 3, wherein said independently generating comprises generating the first and second bank-specific isolation control signals based on stored information identifying locations in a memory bank having an anomalous bitline leakage for each of the memory banks.

6. A semiconductor memory device comprising:
   a. a plurality of memory banks, each memory bank comprising a plurality of memory arrays and sense amplifier columns comprising a plurality of sense amplifiers, wherein there is a sense amplifier column positioned between and shared by memory arrays on opposites thereof; and
   b. bank-specific control logic associated with each of the memory banks, wherein each bank-specific control logic generates first and second bank- specific isolation control signals for a corresponding one of the plurality of memory banks depending on existence and location of an anomalous bitline leakage in the memory bank, wherein said first and second bank-specific isolation control signals are routed to sense amplifier columns in the corresponding memory bank such that the same side of all the sense amplifier columns in the memory bank is isolated from a memory array when in an unselected state.

7. The memory device of claim 6, and further comprising a plurality of fuses associated with each of the memory banks, wherein one or more of the plurality of fuses is blown to identify locations in a memory bank having an anomalous bitline leakage for each of the memory banks, and wherein the bank-specific control logic generates the first and second bank-specific isolation control signals based on states of said plurality of fuses for the corresponding memory bank.

8. The memory device of claim 6, wherein said bank-specific control logic generates the first and second bank-specific isolation control signals based on stored information identifying locations in a memory bank having an anomalous bitline leakage for each of the memory banks.

9. The memory device of claim 6, wherein said first and second bank-specific isolation control signals are routed to the sense amplifier columns in the corresponding memory banks such that both sides of all the sense amplifier columns are isolated from memory arrays.

10. A semiconductor memory device comprising:
 a. means for storing data in a plurality of memory arrays comprised of storage cells;
 b. a plurality of means for sensing interspersed between memory arrays such that a means for sensing is shared by the memory arrays on opposite sides thereof; and
 c. means for generating first and second control signals that is are connected to the plurality of means for sensing such that the same side of all of the means for sensing is isolated from a memory array in corresponding memory bank when in an unselected state depending on existence and location of an anomalous bitline leakage in the memory bank.

11. The memory device of claim 10, wherein said means for generating generates the first and second control signals based on stored information identifying locations having the anomalous bitline leakage for the memory bank.

* * * * *